United States Patent
Liu

(10) Patent No.: US 12,150,261 B2
(45) Date of Patent: Nov. 19, 2024

(54) HINGE COMPONENT, FOLDABLE SCREEN ASSEMBLY AND FOLDABLE TERMINAL DEVICE

(71) Applicant: BEIJING XIAOMI MOBILE SOFTWARE CO., LTD., Beijing (CN)

(72) Inventor: Jianwei Liu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 71 days.

(21) Appl. No.: 17/708,946

(22) Filed: Mar. 30, 2022

(65) Prior Publication Data

US 2023/0156941 A1 May 18, 2023

(30) Foreign Application Priority Data

Nov. 16, 2021 (CN) .......................... 202111355108.9

(51) Int. Cl.
- *H05K 5/02* (2006.01)
- *F16C 11/04* (2006.01)
- *H05K 5/00* (2006.01)

(52) U.S. Cl.
CPC ............ *H05K 5/0226* (2013.01); *F16C 11/04* (2013.01); *H05K 5/0017* (2013.01)

(58) Field of Classification Search
CPC . E05Y 2201/62; H05K 5/0226; G06F 1/1652; G06F 1/1681
See application file for complete search history.

(56) References Cited

U.S. PATENT DOCUMENTS

| | | | | |
|---|---|---|---|---|
| 10,466,747 | B2 * | 11/2019 | Yun ......................... | G09F 9/301 |
| 10,678,305 | B1 * | 6/2020 | Lee ....................... | H04M 1/022 |
| 10,831,242 | B1 * | 11/2020 | He ....................... | H04M 1/0268 |
| 11,696,415 | B2 * | 7/2023 | Xie ..................... | H04M 1/0216 |
| | | | | 361/807 |
| 11,812,568 | B2 * | 11/2023 | Xie ........................ | G06F 1/1652 |
| 2015/0089974 | A1 * | 4/2015 | Seo ....................... | A44C 5/0076 |
| | | | | 63/1.13 |
| 2016/0349802 | A1 * | 12/2016 | Ahn ...................... | G06F 1/1681 |
| 2018/0049329 | A1 * | 2/2018 | Seo ....................... | G06F 1/1681 |
| 2019/0033920 | A1 * | 1/2019 | Yun ....................... | G06F 1/1641 |
| 2020/0029449 | A1 * | 1/2020 | Makinen ............... | G06F 1/1681 |
| 2020/0409431 | A1 * | 12/2020 | Fan ..................... | H04M 1/0268 |
| 2020/0413557 | A1 * | 12/2020 | Zhang .................... | E05D 3/122 |
| 2022/0346256 | A1 * | 10/2022 | Kim ..................... | G06F 1/1652 |
| 2023/0180403 | A1 * | 6/2023 | Ahn .................... | H05K 5/0217 |
| | | | | 361/807 |
| 2023/0315153 | A1 * | 10/2023 | Dias Duarte ......... | G06F 1/1649 |
| | | | | 361/679.27 |

OTHER PUBLICATIONS

European Patent Application No. 22165586.3 extended Search and Opinion dated Sep. 1, 2022, 7 pages.

\* cited by examiner

*Primary Examiner* — Rockshana D Chowdhury
*Assistant Examiner* — Douglas R Burtner
(74) *Attorney, Agent, or Firm* — Cozen O'Connor

(57) ABSTRACT

A hinge component, a foldable screen assembly and a foldable terminal device are provided. The hinge component includes a support assembly and a linkage assembly, the support assembly includes at least three support members, the at least three support members are arranged side by side, and two adjacent support members are movably connected. The linkage assembly is connected with the at least three support members to achieve a mutual linkage of the at least three support members.

16 Claims, 3 Drawing Sheets

HINGE COMPONENT, FOLDABLE SCREEN ASSEMBLY AND FOLDABLE TERMINAL DEVICE

CROSS-REFERENCE TO RELATED APPLICATION

The present application claims the benefit of priority to Chinese Application No. 202111355108.9, filed on Nov. 16, 2021, the contents of which are incorporated herein by reference in their entireties for all purposes.

BACKGROUND

With the development of electronic products, flexible, foldable screens are widely used in electronic product display terminals, such as mobile phones, computers, and other terminal devices, and the resultant mobile phone and computer with a foldable screen will become development trends in the future. For a terminal device which is foldable in form, a hinge component is very important, and performance of the hinge may directly affect the function and user experience of the whole device.

At present, the hinge component for achieving the folding function of the foldable screen occupies a relatively large space, which is not conducive to the lightweight structure stacking of the terminal device. Moreover, during the folding of the flexible screen, the hinge component cannot be effectively fitted with and fully support the flexible screen, thus resulting in wrinkles and deformation due to pulling during the folding of the flexible screen.

SUMMARY

The present disclosure relates to a field of hinge connection, and more particularly to a hinge component, a foldable screen assembly and a foldable terminal device.

Embodiments of a first aspect of the present disclosure provide a hinge component. The hinge component includes a support assembly and a linkage assembly, the support assembly includes at least three support members, the at least three support members are arranged side by side, and two adjacent support members are movably connected. The linkage assembly is connected with the at least three support members to achieve a mutual linkage of the at least three support members.

Embodiments of a second aspect of the present disclosure further provide a foldable screen assembly, and the foldable screen assembly includes a flexible screen and a hinge component. The flexible screen is on the hinge component and covers the hinge component. The hinge component includes a support assembly and a linkage assembly, the support assembly includes at least three support members, the at least three support members are arranged side by side, and two adjacent support members are movably connected. The linkage assembly is connected with the at least three support members to achieve a mutual linkage of the at least three support members.

Embodiments of a third aspect of the present disclosure further provide a foldable terminal device, and the foldable terminal device includes a foldable screen assembly. The foldable screen assembly includes a flexible screen and a hinge component. The flexible screen is on the hinge component and covers the hinge component. The hinge component includes a support assembly and a linkage assembly, the support assembly includes at least three support members, the at least three support members are arranged side by side, and two adjacent support members are movably connected. The linkage assembly is connected with the at least three support members to achieve a mutual linkage of the at least three support members.

DETAILED DESCRIPTION

Figure 1:
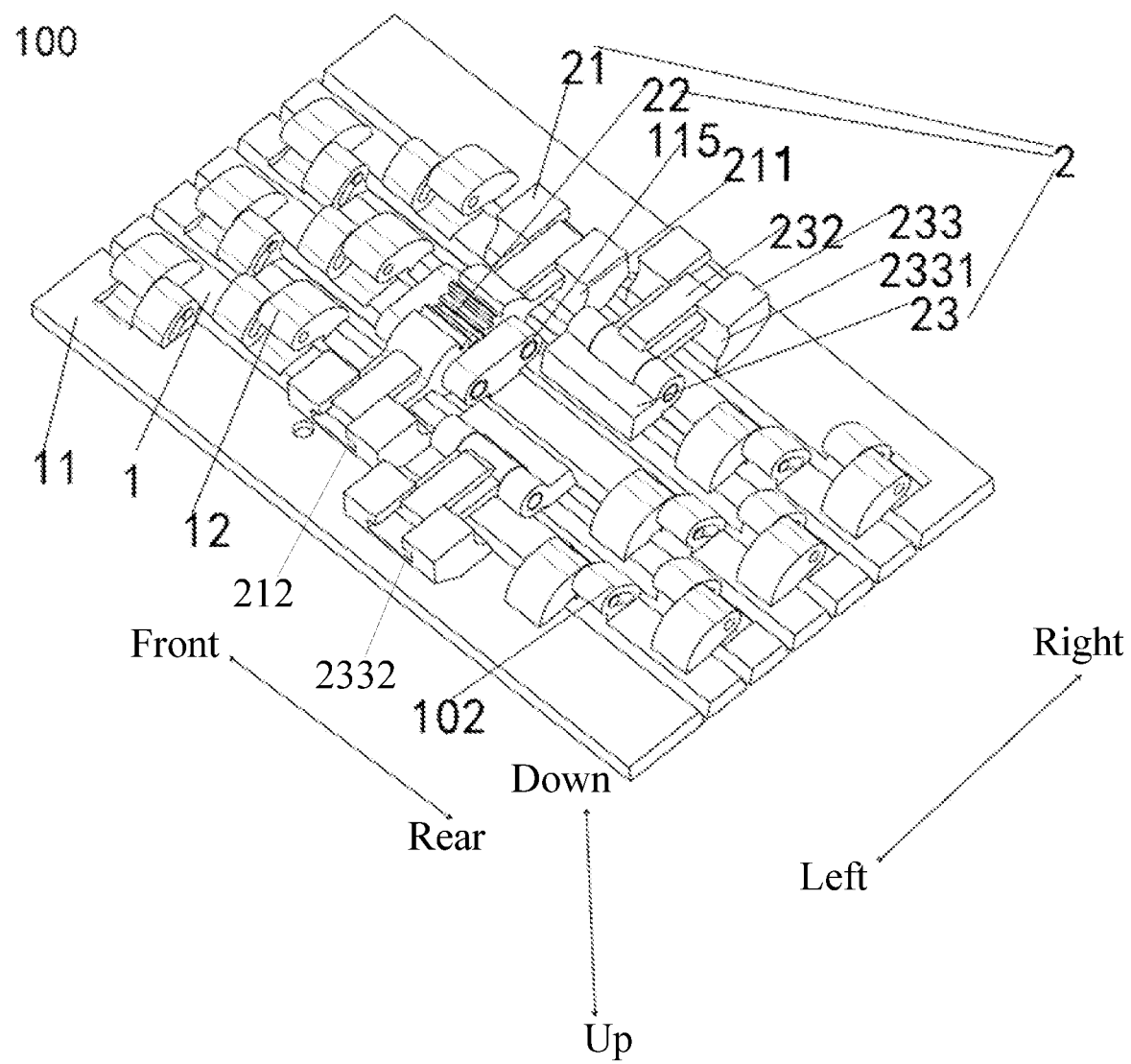
FIG. 1 is a schematic view of a hinge component according to an embodiment of the present disclosure.

The principle of a hinge component for achieving the screen folding in the related art is described as follows. In order to better understand the technical solution in the related art, the technical solution in the related art is described in a condition that a length direction of a support member is consistent with a front-rear direction, a thickness direction of the support member is consistent with an up-down direction, and a width direction of the support member is consistent with a left-right direction. For purposes of discussions herein, references to the left-right direction, the up-down direction and the front-rear direction will correspond to those shown in FIG. 1.

The hinge component in the related art includes a support member and a linkage assembly on the support member, and the hinge component is configured to connect a housing with a screen (a flexible screen) of a mobile phone. Specifically, more than one support member is arranged side by side in a certain order, such as from left to right or from right to left, and the more than one support member together serves as a base below the screen and configured to support the screen. The support member has two opposite sides in the thickness direction. In other words, the support member has an upper surface and a lower surface opposite to each other in the up-down direction, the linkage assembly is below the lower surface of the support member, and the screen is above the upper surface of the support member. The hinge component may connect the housing with the screen of the mobile phone, by being connected to the screen through studs or holes on leftmost and rightmost support members, and by being connected to a middle frame of the housing of the mobile phone via a screw, so as to achieve the folding of the screen by means of the synchronous movement and rotation of the linkage assembly.

However, the support members are linked only by the linkage assembly, so that the hinge component occupies a relatively large space, which is not conducive to the lightweight structural stacking of a terminal device, and also the hinge component cannot be effectively fitted with and fully support the screen, thus resulting in defects such as wrinkles and deformation due to pulling during the folding of the screen. Therefore, an urgent technical problem to be solved by those skilled in the related art is how to effectively overcome the technical defects that the hinge component occupies a relatively large space and cannot be effectively fitted with and fully support the screen in the related art.

Embodiments of the present disclosure are described in detail below, and examples of the embodiments are shown in the accompanying drawings. The same or similar elements and the elements having same or similar functions are denoted by like reference numerals throughout the descriptions. The embodiments described below with reference to the accompanying drawings are exemplary, are merely used to explain the present disclosure, and cannot be construed to limit the present disclosure.

Figure 2:
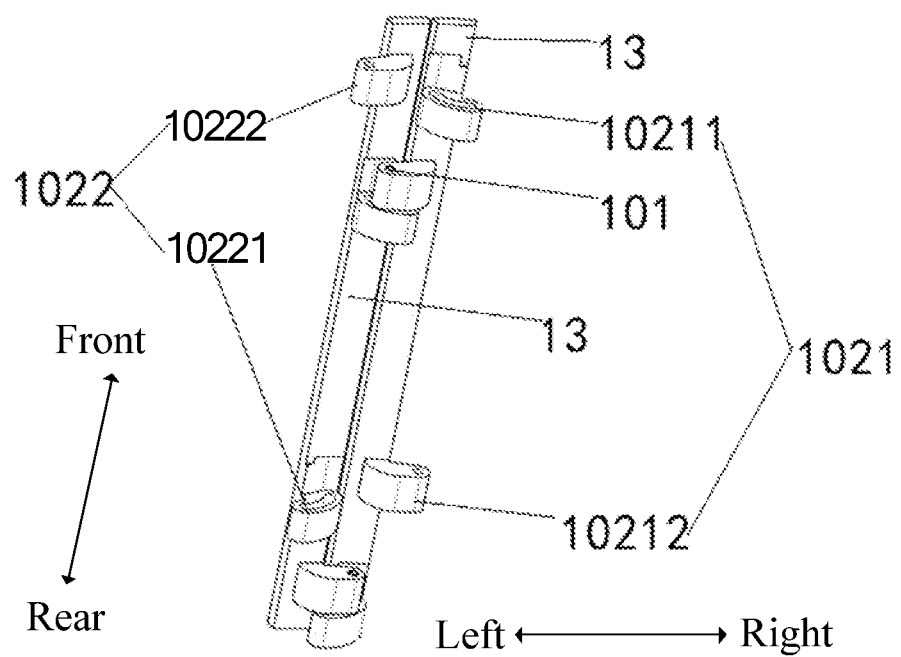
FIG. 2 is a schematic view of a support member according to an embodiment of the present disclosure.
Figure 3:
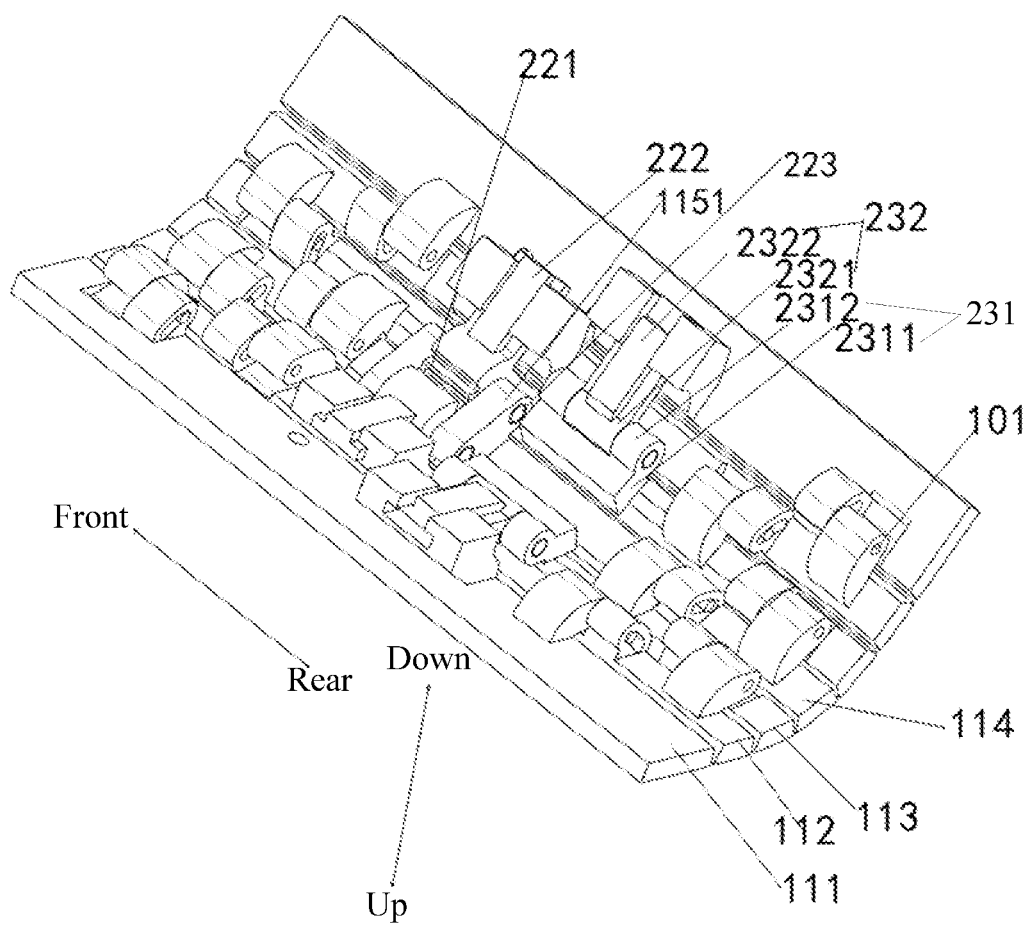
FIG. 3 is another schematic view of a hinge component according to an embodiment of the present disclosure.

As shown in FIGS. 1 to 3, an embodiment of the present disclosure proposes a hinge component 100 including a support assembly 1 and a linkage assembly 2, the support assembly 1 includes at least three support members 11, the at least three support members 11 are arranged side by side in a length direction, and two adjacent support members 11 are movably connected. The linkage assembly 2 is connected with the at least three support members 11 to achieve a mutual linkage of the at least three support members 11.

Specifically, as shown in FIG. 1, the support assembly 1 in this embodiment has two opposite sides in a thickness direction, that is, the support assembly 1 has an upper surface and a lower surface opposite to each other in an up-down direction. The linkage assembly 2 is below the lower surface of the support assembly 1, and a screen is above and covers the upper surface of the support assembly 1. In this embodiment, left and right ends of the screen may be bent and folded synchronously towards a side where the linkage assembly 2 is, as shown in FIG. 3, and the linkage assembly 2 in this embodiment ensures the synchronous movement of the at least three support members 11 that are symmetrical.

In order to better understand the technical solution of the present disclosure, the technical solution in the present disclosure is described in a condition that a length direction of the support member 11 is consistent with a front-rear direction, a thickness direction of the support member 11 is consistent with an up-down direction, and a width direction of the support member 11 is consistent with a left-right direction. The left-right direction, the up-down direction and the front-rear direction are shown in FIG. 1 and FIG. 3.

Specifically, as shown in FIG. 1, in this embodiment, the at least three support members 11 are arranged side by side, which may be understood as that the at least three support members 11 are arranged side by side in a certain order, such as from left to right, and adjacent support members 11 are movably connected. For example, a support member B and a support member C are at a left side and a right side of a support member A, respectively, and both the support member B and the support member C may rotate relative to the support member A.

In this embodiment, through the movable connection between the two adjacent support members 11, the support members 11 may be further refined. That is, in the case of supporting the same screen, compared with the related art, the number of the support members 11 may be increased and the width of the support member 11 may be reduced in this embodiment, so as to achieve a purpose of refining support areas, thus overcoming the technical defect of the large space occupation of the hinge component 100 as a whole, and promoting the lightweight structure stacking of the terminal device. Moreover, the hinge component 100 may be effectively fitted with and fully support the screen, so as to overcome the technical defects of wrinkles and deformation due to pulling during the folding of the screen in the related art.

It may be understood that the screen in this embodiment may be a display screen, in particular, a flexible screen, of a terminal device such as a mobile phone and a computer. The flexible screen may be understood by those skilled in the related art as a light and non-fragile display screen which has characteristics of a traditional flat panel display screen and is manufactured on a flexible substrate that can be bent, flexed, folded, twisted or rolled.

In some embodiments, each support member 11 includes at least two guide portions 102, and the guide portions 102 face towards two sides of the support member 11 in the width direction and are movably connected with the guide portions 102 on an adjacent support member 11. The guide portions 102 are configured to guide and limit the adjacent support members 11 during the rotation of the hinge component 100.

Specifically, as shown in FIG. 1, each support member 11 is provided with at least two guide portions 102, the two guide portions 102 are located at two ends of the support member 11 in the length direction, respectively, that is, one guide portion 102 is located at a front end of the support member 11 and the other guide portion 102 is located at a rear end of the support member 11. Two guide portions face towards a left side and a right side of the support member 11, respectively. For example, the guide portion 102 facing leftwards (i.e. towards the left side of the support member 11) of the support member 11 is movably connected with the guide portion 102 facing rightwards (i.e. towards the right side of another support member 11) of another support member 11 adjacent to the left side of this support member 11. According to this law, the at least three support members 11 are arranged side by side, and the adjacent support members 11 are movably connected.

It may be understood that the guide portion 102 is arranged or coupled to the support member 11 by means of one of fixing, detachable connection or integrated molding.

In some embodiments, the guide portion 102 includes a first guide portion 1021 and a second guide portion 1022. At least one first guide portion 1021 and at least one second guide portion 1022 are on the support member 11 (i.e. each support member 11). The first guide portion 1021 and the second guide portion 1022 extend towards two sides of the support member 11 in the width direction and beyond edges of the corresponding sides of the support member 11, and the first guide portion 1021 of the support member 11 is movably connected with the second guide portion 1022 of the adjacent support member 11.

At least one first guide portion 1021 and at least one second guide portion 1022 being on the support member 11 may be understood as at least two following solutions.

The first technical solution is that one first guide portion 1021 and one second guide portion 1022 are on the support member 11. In this case, the support member 11 is movably connected with the left and right adjacent support members 11 through the one first guide portion 1021 and the one second guide portion 1022. That is, there is only one movable connection joint between the adjacent support members 11, and the stability between the support members 11 is relatively poor.

The second technical solution is that more than one first guide portion 1021 and more than one second guide portion 1022 are on the support member 11. Similarly, in this case, the support member 11 is movably connected with the second guide portions 1022 and the first guide portions 1021 at the left and right adjacent support members 11 through the more than one first guide portion 1021 and the more than one second guide portion 1022, respectively. It may be understood that for the support member 11 provided with the more than one first guide portion 1021 and the more than one second guide portion 1022, compared with the support member 11 provided with the one first guide portion 1021 and the one second guide portion 1022, there are more movable connection joints between the support member 11 and the adjacent support member 11. Although the stability of the hinge component 100 is stronger, it is not conducive to the lightweight structure stacking of the hinge component 100.

As shown in FIGS. 1 and 2, two first guide portions 1021 and two second guide portions 1022 are on the support member 11, and the first guide portion 1021 and the second guide portion 1022 are located at the front end and the rear end of the support member 11, respectively, and face towards the left side and the right side of the support member 11, respectively. For example, the first guide portion 1021 extends rightwards, and an end of the first guide portion 1021 extends beyond an edge of the right side of the support member 11. Similarly, the second guide portion 1022 extends leftwards, and an end of the second guide portion 1022 extends beyond an edge of the left side of the support member 11, so as to achieve the movable connection between the first guide portion 1021 of the support member 11 and the second guide portion 1022 of the adjacent support member 11. Furthermore, each support member 11 and its left and right adjacent support members 11 have one movable connection joint at either of the front end and the rear end of each support member 11, so as to achieve the stable connection of the at least three support members 11, and facilitate the lightweight structure stacking of the hinge component 100.

It may be understood that the relative positions of the first guide portions 1021 and the second guide portions 1022 of the adjacent support members 11 are not limited in the present invention, as long as the first guide portion 1021 and the second guide portion 1022 of the support member 11 can be fitted with the second guide portion 1022 and the first guide portion 1021 of the adjacent support member 11, respectively.

For example, in FIG. 1, at the front end and the rear end of the support member 11, the first guide portion 1021 and the second guide portion 1022 of the support member 11 on the right side are alternated with the first guide portion 1021 and the second guide portion 1022 of the adjacent support member 11 on the left side, in the length direction of the support member 11. For another example, in FIG. 2, at the front end of the support member 11, the first guide portion 1021 and the second guide portion 1022 of the support member 11 on the right side are arranged between the first guide portion 1021 and the second guide portion 1022 of the adjacent support member 11 on the left side, in the length direction of the support member 11, while at the rear end of the support member 11, the first guide portion 1021 and the second guide portion 1022 of the adjacent support member 11 on the left side are arranged between the first guide portion 1021 and the second guide portion 1022 of the support member 11 on the right side, in the length direction of the support member 11. That is, FIG. 1 and FIG. 2 illustrate different examples of the support member 11 with regard to the relative positions of the first guide portions 1021 and the second guide portions 1022 of the adjacent support members 11.

In some embodiments, the support member 11 includes a first body 13 and at least one first connecting portion 12. The first connecting portion 12 is connected with the first body 13 and is located on at least one side of the first body 13 in a thickness direction of the first body 13. At least one first guide portion 1021 and at least one second guide portion 1022 are on each first connecting portion 12. It may be understood that the first connecting portion 12 is configured to carry the first guide portion 1021 and the second guide portion 1022.

In this embodiment, the thickness direction of the first body 13 is consistent with the up-down direction in FIG. 1. It may be understood that the first body 13 has an upper surface and a lower surface opposite to each other in the up-down direction, and the first connecting portion 12 is below the lower surface of the first body 13, or the first connecting portion 12 is above the upper surface of the first body 13, or the first connecting portions 12 are below the lower surface of the first body 13 and above the upper surface of the first body 13. Advantageously, the first connecting portion 12 is below the lower surface of the first body 13, and the flexible screen is above and directly covers the upper surface of the first body 13 to achieve the connection between the first body 13 and the flexible screen.

The support member 11 is provided with at least one first connecting portion 12, and each first connecting portion 12 is provided with at least one first guide portion 1021 and at least one second guide portion 1022, which may be understood as that one or more first connecting portions 12 are on the support member 11, and each first connecting portion 12 is provided with at least one first guide portion 1021 and at least one second guide portion 1022, which may be understood in the same manner as that at least one first guide portion 1021 and at least one second guide portion 1022 are on the support member 11, and thus is not repeated herein.

It may be understood that the first connecting portion 12 may be a protrusion on the lower surface of the support member 11, and the protrusion extends towards and even beyond the left side or the right side of the support member 11. The first guide portion 1021 and the second guide portion 1022 may include a groove and/or a lever integrated with or mounted to the protrusion, as described in detail below.

In some embodiments, the first guide portion 1021 includes a first sliding groove 10211 and/or a first lever 10212. When the first guide portion 1021 is the first sliding groove 10211, the second guide portion 1022 includes a second lever 10222, and the second lever 10222 of the second guide portion 1022 is slidably connected in the first sliding groove 10211. The first lever 10212 includes a rotating shaft structure 101. When the first guide portion 1021 is the first lever 10212, the second guide portion 1022 includes a second sliding groove 10221, and the first lever 10212 is slidably connected in the second sliding groove 10221 of the second guide portion 1022 through the rotating shaft structure 101. The first sliding groove 10211 and the second sliding groove 10221 may be closed arc grooves.

It should be understood that, the first guide portion 1021 includes the first sliding groove 10211, or the first guide portion 1021 includes the first lever 10212, or the first guide portion 1021 includes the first sliding groove 10211 and the first lever 10212.

When the first guide portion 1021 includes the first sliding groove 10211, the second guide portion 1022 includes the second lever 10222, the first sliding groove 10211 and the second lever 10222 face towards a left side and a right side of the first body 13, respectively, and the first sliding groove 10211 is slidably connected with the second lever 10222 on the adjacent first body 13. Similarly, when the first guide portion 1021 includes the first lever 10212, it is the same as the above situation and is not repeated herein.

Specifically, as shown in FIG. 2, when the first guide portion 1021 includes the first sliding groove 10211 and the first lever 10212, the second guide portion 1022 includes the second lever 10222 and the second sliding groove 10221. For example, the first sliding groove 10211 and the first lever 10212 face towards the right side of the first body 13. In some embodiments, the first sliding groove 10211 and the first lever 10212 are located at a front end and a rear end of the first body 13, respectively. The second sliding groove 10221 and the second lever 10222 face towards the left side of the first body 13 and are located at the front end and the rear end of the first body 13, respectively. The first sliding groove 10211 is slidably connected with the second lever 10222 on the right adjacent first body 13, and the first lever 10212 is slidably connected with the second sliding groove 10221 on the right adjacent first body 13.

For example, as shown in FIG. 2, the first sliding groove 10211 and the second sliding groove 10221 may be provided with an opening, the first lever 10212 and the second lever 10222 include a rotating shaft structure 101, and the rotating shaft structure 101 may be understood as a pin shaft. One end of the pin shaft is mounted to the first lever 10212 through a pin hole formed in the first lever 10212, and the other end of the pin shaft passes through the opening formed in the first sliding groove 10211, so as to achieve the sliding connection between the first lever 10212 and the second sliding groove 10221. In this embodiment, the first guide portion 1021 includes the first sliding groove 10211 and the first lever 10212, and hence the hinge component 100 has higher flexibility, compared with the first guide portion 1021 including the first sliding groove 10211 or the first lever 10212.

In some embodiments, the number of the support members 11 is an odd number.

The minimum number of the support members 11 may be three or other odd numbers such as five, seven and nine. The linkage assembly 2 may ensure the synchronous movement of the movably connected support members 11 on left and right sides. Moreover, the number of the support members 11 is an odd number not less than three, which can ensure that the middlemost support member 11 of the support assembly 1 is motionless, while the support members 11 at the left and right sides move leftwards or rightwards synchronously relative to the middlemost support member 11, so as to ensure the maximum fit to the flexible screen.

In some embodiments, the linkage assembly 2 includes a first sliding seat 21 and a synchronizer 22, and the first sliding seat 21 is arranged on one of the support members 11. One end of the synchronizer 22 is slidably connected with the first sliding seat 21, and the other end of the synchronizer 22 is hinged with another support member 11.

For example, the first sliding seat 21 is arranged on a first one of the at least three support members 11, and the other end of the synchronizer 22 is hinged with a second one of the at least three support members 11.

Specifically, as shown in FIG. 1, two first sliding seats 21 are symmetrically arranged on left and right sides of the support assembly 1, and the two first sliding seats 21 are located on two support member 11 of the support assembly 1 and are mirrored with each other. Two synchronizers 22 are provided. One end of the synchronizer 22 is slidably connected with the first sliding seat 21 on one side, and the other end of the synchronizer 22 is hinged with the middle support member 11 of the support assembly 1. It may be understood that when the support members 11 at the left and right sides of the support assembly 1 rotate relative to the middlemost support member 11, respectively, one end of each of the two synchronizers 22 at the left and right sides is synchronously hinged with the middle support member 11, and the other ends of the synchronizers 22 slide in the first sliding seats 21 on the two sides, so as to achieve that the support members 11 at the left and right sides of the support assembly 1 can move leftwards or rightwards synchronously relative to the middle support member 11. In this embodiment, the middle support member 11 may be the middlemost support member 11.

In some embodiments, the linkage assembly 2 includes a swing arm assembly 23 on at least one support member 11 side by side with the first sliding seat 21 and the synchronizer 22.

Specifically, as shown in FIG. 1 and FIG. 3, the linkage assembly 2 also includes the swing arm assembly 23, and the swing arm assembly 23 is arranged side by side with the first sliding seat 21 and the synchronizer 22 in the front-rear direction of the support member 11. It may be understood that when the support assembly 1 includes three or five support members 11, the first sliding seats 21 are mirrored and symmetrically arranged on the leftmost and rightmost support members 11, one ends of the two synchronizers 22 are connected with the first sliding seats 21 at the left and right sides, respectively, and the other ends of the two synchronizers 22 are hinged with the middlemost support member 11 of the support assembly 1, so as to achieve that the support members 11 at the left and right sides of the support assembly 1 can rotate leftwards or rightwards synchronously relative to the middle support member 11. In this embodiment, the middle support member 11 may be the middlemost support member 11.

When the support assembly 1 includes seven support members 11, the above arrangement cannot achieve that individual support members 11 at the left and right sides of the support assembly 1 can rotate leftwards or rightwards synchronously relative to the middle support member 11. In this embodiment, the middle support member 11 may be the middlemost support member 11. Advantageously, the swing arm assembly 23 may be provided, the five support members 11 at the middle of the support assembly 1 may be arranged as the above arrangement of the synchronizers 22 and the first sliding seats 21, the swing arm assembly 23 is configured to connect the support member 11 on an outer side with the support member 11 on an inner side, such that the support member 11 on the outer side is linked with the support member 11 on the inner side. It may be understood that the support members 11 at the middle of the support assembly 1 include the support member 11 on the inner side.

It may be understood that when the number of the support members 11 in the support assembly 1 is greater than seven, one swing arm assembly 23 needs to be added for each additional two support members 11, so as to achieve that the individual support members 11 at the left and right sides of the support assembly 1 can move leftwards or rightwards synchronously relative to the middle support member 11. In this embodiment, the middle support member 11 may be the middlemost support member 11.

In some embodiments, the swing arm assembly 23 includes a second fixed seat 231, a swing arm 232 and a second sliding seat 233, and the second fixed seat 231 is fixed on one of the support members 11. One end of the swing arm 232 is hinged with the second fixed seat 231, the other end of the swing arm 232 is slidably connected with the second sliding seat 233, and the second sliding seat 233 is fixed on another support member 11.

For example, the second fixed seat 231 is fixed on a third one of the at least three support members 11, and the second sliding seat 233 is fixed on a fourth one of the at least three support members 11.

Specifically, as shown in FIG. 1 and FIG. 3, two second sliding seats 233 are provided, located on the leftmost and rightmost support members 11, respectively, and mirrored with each other. Two second fixed seats 231 are provided. The support member 11 provided with the second fixed seat 231 is located between the support member 11 provided with the first sliding seat 21 and the support member 11 hinged with the synchronizer 22, and the support member 11 provided with the first sliding seat 21 is located between the support member 11 provided with the second sliding seat 233 and the support member 11 provided with the second fixed seat 231. One end of the swing arm 232 is connected with the second sliding seat 233 and configured to slide relative to the second sliding seat 233, and the other end of the swing arm 232 is hinged with the second fixed seat 231.

When the support members 11 at the left and right sides of the support assembly 1 rotate relative to the middlemost support member 11, respectively, the support members 11 provided with the second sliding seat 233 and the second fixed seat 231 are linked with the support members 11 provided with the first sliding seat 21 and the synchronizer 22, so as to achieve that the individual support members 11 at the left and right sides of the support assembly 1 can move leftwards or rightwards synchronously relative to the middle support member 11. In this embodiment, the middle support member 11 may be the middlemost support member 11.

In some embodiments, the support assembly 1 includes a first support member 111 located on the outermost side, a second support member 112 adjacent to the first support member 111, a third support member 113 adjacent to the second support member 112, and a fourth support member 114 located at middle. The second sliding seat 233 is fixed on the first support member 111, the first sliding seat 21 is fixed on the second support member 112, the second fixed seat 231 is fixed on the third support member 113, the fourth support member 114 is provided with a first fixed seat 115, and the first fixed seat 115 is hinged with the other end of the synchronizer 22.

Specifically, as shown in FIG. 3, the support members 11 from left to right are the first support member 111, the second support member 112, the third support member 113, the fourth support member 114, the third support member 113, the second support member 112 and the first support member 111, respectively. It may be understood that the first support members 111 at the left and right sides are symmetrical in the left-right direction relative to the fourth support member 114 at middle. Similarly, the second support members 112 at the left and right sides and the third support members 113 at the left and right sides may be arranged in the same way. Two second sliding seats 233 are fixed on the two first support members 111 on the two sides, respectively, and two first sliding seats 21 are fixed on the two second support members 112 on the two sides, respectively. Two second fixed seats 231 are fixed on the two third support members 113 on the two sides, respectively, and the first fixed seat 115 is fixed on the fourth support member 114.

For example, taking the synchronizer 22 and the swing arm 232 at one side as an example, one end of the synchronizer 22 is hinged with the first fixed seat 115 on the fourth support member 114, and the other end of the synchronizer 22 is slidably connected with the first sliding seat 21 on the second support member 112; one end of the swing arm 232 is hinged with the second fixed seat 231 on the third support member 113, and the other end of the swing arm 232 is slidably connected with the second sliding seat 233 on the first support member 111. The synchronizers 22 may drive the second support members 112 and the third support members 113 at the left and right sides to rotate synchronously relative to the fourth support member 114, and the swing arm 232 connects the first support member 111 with the third support member 113. When the second support members 112 and the third support members 113 at the left and right sides rotate synchronously relative to the fourth support member 114, and the first support member 111 and the third support member 113 keep linked, so as to achieve the synchronous rotation of the support members 11 at the left and right sides relative to the fourth support member 114.

In some embodiments, the synchronizer 22 is connected to the first fixed seat 115 at a same height as the synchronizer 22 is connected to the first sliding seat 21 in the up-down direction, and the swing arm 232 is connected to the second fixed seat 231 at a same height as the swing arm 232 is connected to the second sliding seat 233 in the up-down direction. In this embodiment, the first fixed seat 115 and the second fixed seat 231 may ensure that when the flexible screen is unfolded, the synchronizer 22 and the swing arm 232 remain horizontal in the left-right direction, so as to provide a stable support force for the flexible screen in an unfolded state. In addition, the synchronizer 22 and the swing arm 232 can also provide a stable support force for the flexible screen in a folded state.

In some embodiments, the synchronizer 22 includes an engaging portion 221, a first leading portion 222 and a first hinged portion 223, and the engaging portions 221 on different synchronizers 22 are engaged with each other. The first leading portion 222 extends from the engaging portion 221 along the width direction of the support member 11, the first sliding seat 21 is provided with a first slot 212, the first leading portion 222 is movably inserted in the first slot 212, the first hinged portion 223 extends from the engaging portion 221 along the length direction of the support member 11, and the first hinged portion 223 is hinged with the first fixed seat 115.

In some embodiments, as shown in FIG. 3, the engaging portion 221 is a gear structure, and the gear structures on different synchronizers 22 at the two sides are engaged with each other to maintain the absolute synchronization of the individual support members 11 at the left and right sides of the support assembly 1. The first hinged portion 223 extends from the engaging portion 221 in the front-rear direction, and the first hinged portion 223 is hinged with a front end and a rear end of the first fixed seat 115. For example, the first hinged portion 223 is a rod pin, the first fixed seat 115 and the engaging portion 221 have a pin hole, and the rod pin passes through the pin holes in the first fixed seat 115 and the engaging portion 221, respectively, so as to achieve the hinged connection between the synchronizer 22 and the first fixed seat 115. The hinged connection between the synchronizer 22 and the first fixed seat 115 in this embodiment also may be achieved in other ways, which will not be listed herein.

The first leading portion 222 extends from the engaging portion 221 along the left-right direction of the support member 11. The first sliding seat 21 is provided with the first slot 212. The first leading portion 222 is movably inserted in the first slot 212. The first slot 212 may limit the first leading portion 222, such that the first leading portion 222 moves linearly in the first sliding seat 21 along the first slot 212, and is movably inserted in the first sliding seat 21.

In some embodiments, the swing arm 232 includes a second hinged portion 2321 and a second leading portion 2322. Two ends of the second hinged portion 2321 in the length direction of the support member 11 are hinged with the second fixed seat 231. One end of the second leading portion 2322 is connected with a middle part of the second hinged portion 2321, the second sliding seat 233 is provided with a second slot 2332, and the other end of the second leading portion 2322 is movably inserted in the second slot 2332.

Specifically, as shown in FIGS. 1 and 3, a front end and a rear end of the second hinged portion 2321 are hinged with the second fixed seat 231. In some embodiments, the second fixed seat 231 includes a second body 2311 and a second support portion 2312. The second support portion 2312 is located on a side of the second body 2311 in the width direction of the support member 11 and faces towards the second sliding seat 233. The second hinged portion 2321 may be understood as a shaft pin, one end of the second leading portion 2322 is connected with a middle part of the shaft pin, the second fixed seat 231 is provided with shaft holes, and two ends of the shaft pin pass through the shaft holes in the second fixed seat 231, respectively, so as to achieve the hinged connection between the second leading portion 2322 and the second fixed seat 231. The other end of the second leading portion 2322 is movably inserted in the second slot 2332, such that the folding and unfolding of the hinge component 100 can be achieved by the linear movement of the second leading portion 2322 in the second sliding seat 233 along the second slot 2332.

In some embodiments, the first fixed seat 115 includes two first support portions 1151 opposite to and spaced apart from each other, the first hinged portion 223 is hinged with the first support portion 1151, and the engaging portion 221 is located between the two first support portions 1151.

It should be noted that the first fixed seat 115 includes two first support portions 1151, and the synchronizers 22 on the two sides need to be hinged with the first fixed seat 115, respectively, such that the space occupied by the linkage assembly 2 is small as a whole, which is conducive to the lightweight structure stacking of the whole machine and the avoidance of other components in space.

In some embodiments, the first sliding seat 21 includes a first recessed portion 211 at a side facing towards the first fixed seat 115; and/or, the second sliding seat 233 includes a second recessed portion 2331 at a side facing towards the second fixed seat 231.

Specifically, as shown in FIG. 1, the first recessed portion 211 is at the side of the first sliding seat 21 facing towards the first fixed seat 115, and the second recessed portion 2331 is at the side of the second sliding seat 233 facing towards the second fixed seat 231. The first recessed portion 211 and the second recessed portion 2331 prevent the first fixed seat 115 and the second fixed seat 231 from limiting the first sliding seat 21 and the second sliding seat 233 during the bending of the hinge component 100, to avoid components in space.

The present disclosure also provides a foldable screen assembly, including a flexible screen and the hinge component 100 according to any one of the above embodiments, and the flexible screen is on the hinge component 100 and covers the hinge component 100.

The present disclosure also provides a foldable terminal device, including the hinge component 100 according to any one of the above embodiments or the above foldable screen assembly.

The hinge component 100, the foldable screen assembly and the foldable terminal device in the present disclosure have a large number of support members 11 to refine the support fineness, so as to effectively fit with and fully support the screen, thus overcoming the technical defects of wrinkles and deformation due to pulling during the folding of the screen in the related art. Moreover, the occupied space is small as a whole, which is convenient to the lightweight structure stacking of the whole machine.

In the descriptions of the embodiments of the present disclosure, it is to be understood that, terms such as "center", "longitudinal", "lateral", "length", "width", "thickness", "upper", "lower", "front", "rear", "left", "right", "vertical", "horizontal", "top", "bottom", "inner", "outer", "axial", "radial" and "circumferential" should be construed to refer to the orientation or position as shown in the accompanying drawings. These relative terms are merely for convenience of descriptions and do not indicate or imply that the device or element referred to should have a particular orientation, or should be constructed or operated in a particular orientation, and thus cannot be construed as a limit to the present disclosure.

In addition, terms such as "first" and "second" are used herein for purposes of description and are not intended to indicate or imply relative importance or significance or to imply the number of indicated technical features. Thus, the feature defined by "first" and "second" may comprise one or more of this feature. In the description of the present disclosure, "a plurality of" means two or more than two, unless specified otherwise.

In the present disclosure, it should be noted that, unless specified otherwise, terms "mounted", "coupled", "connected" and "fixed" should be understood broadly, for example, may be fixed connections, detachable connections, or integral connections; may also be mechanical or electrical connections or intercommunications; may also be direct connections or indirect connections via intervening structures; may also be inner communications or interactions of two elements, which may be understood by those skilled in the related art according to specific situations.

In the descriptions of the present disclosure, it should be noted that, unless otherwise expressly specified and limited, the first feature "on" or "under" the second feature may be that the first and second features are in direct contact, or that the first and second features are in indirect contact through an intermediate medium. Moreover, the first feature "over", "above" and "on" the second feature may be that the first feature is directly above or obliquely above the second feature, or merely be that the first feature has a level higher than the second feature. The first feature "beneath", "below" and "under" the second feature may be that the first feature is directly below or obliquely below the second feature, or merely be that the first feature has a level less than the second feature.

Reference throughout this specification to terms "an embodiment", "some embodiments", "an example", "a specific example" or "some examples" means that a particular feature, structure, material, or characteristic described in connection with the embodiment or example is included in at least one embodiment or example of the present disclosure. In this specification, exemplary descriptions of aforesaid terms are not necessarily referring to the same embodiment or example. Moreover, the particular features, structures, materials, or characteristics described may be combined in any suitable manner in one or more embodiments or examples. Furthermore, in the case of non-contradiction, those skilled in the art may combine and group the different embodiments or examples described in this specification and the features of the different embodiments or examples.

Although explanatory embodiments have been illustrated and described, it would be appreciated by those skilled in the art that the above embodiments are exemplary and cannot be construed to limit the present disclosure, and changes, modifications, alternatives and varieties can be made in the embodiments by those skilled in the art without departing from scope of the present disclosure.

What is claimed is:

1. A hinge component, comprising:
   a support assembly comprising at least three support members, the at least three support members being arranged side by side, and two adjacent support members being movably connected; and
   a linkage assembly connected with the at least three support members to achieve a mutual linkage of the at least three support members,
   wherein the linkage assembly comprises:
   a first sliding seat on a first one of the at least three support members; and
   a synchronizer comprising a first end slidably connected with the first sliding seat, and a second end hinged with a second one of the at least three support members,
   wherein the linkage assembly comprises a swing arm assembly on at least one support member side by side with the first sliding seat and the synchronizer,
   wherein the swing arm assembly comprises:
   a second fixed seat fixed on a third one of the at least three support members;
   a swing arm, a first end of the swing arm being hinged with the second fixed seat; and
   a second sliding seat, a second end of the swing arm being slidably connected with the second sliding seat, and the second sliding seat being fixed on a fourth one of the at least three support members,
   wherein the swing arm comprises:
   a second hinged portion comprising two ends hinged with the second fixed seat in a length direction of the support member; and
   a second leading portion, a first end of the second leading portion being connected with a middle part of the second hinged portion, the second sliding seat comprising a second slot, and a second end of the second leading portion being movably inserted in the second slot.

2. The hinge component according to claim 1, wherein the support member comprises at least two guide portions, and the guide portions face towards two sides of the support member in a width direction of the support member and are movably connected with the guide portions on an adjacent support member.

3. The hinge component according to claim 2, wherein the guide portion comprises a first guide portion and a second guide portion, at least one first guide portion and at least one second guide portion are on the support member, the first guide portion and the second guide portion extend towards the two sides of the support member in the width direction of the support member and beyond edges of corresponding sides of the support member, and the first guide portion of the support member is movably connected with the second guide portion of the adjacent support member.

4. The hinge component according to claim 3, wherein the support member comprises:
   a first body; and
   at least one first connecting portion connected with the first body and located on at least one side of the first body in a thickness direction of the first body, at least one first guide portion and at least one second guide portion being on the first connecting portion.

5. The hinge component according to claim 3, wherein the first guide portion comprises a first sliding groove, the second guide portion comprises a second lever, and the first sliding groove is slidably connected with the second lever of the second guide portion.

6. The hinge component according to claim 3, wherein the first guide portion comprises a first lever, the first lever comprises a rotating shaft structure, the second guide portion comprises a second sliding groove, and the first lever is slidably connected with the second sliding groove of the second guide portion through the rotating shaft structure.

7. The hinge component according to claim 3, wherein the first guide portion comprises a first sliding groove and a first lever, the second guide portion comprises a second lever and a second sliding groove, the first lever comprises a rotating shaft structure, the first sliding groove is slidably connected with the second lever of the second guide portion, and the first lever is slidably connected with the second sliding groove of the second guide portion through the rotating shaft structure.

8. The hinge component according to claim 1, wherein a number of the support members is an odd number.

9. The hinge component according to claim 1, wherein the support assembly comprises:
   a first support member located on the outermost side, the second sliding seat being fixed on the first support member;
   a second support member adjacent to the first support member, the first sliding seat being fixed on the second support member;
   a third support member adjacent to the second support member, the second fixed seat being fixed on the third support member; and
   a fourth support member located at middle, the fourth support member comprising a first fixed seat hinged with the second end of the synchronizer.

10. The hinge component according to claim 9, wherein the synchronizer comprises:
    an engaging portion engaged with an engaging portion of another synchronizer symmetrical to the synchronizer with respect to the fourth support member;
    a first leading portion extending from the engaging portion along a width direction of the support member, the first sliding seat comprising a first slot, the first leading portion being movably inserted in the first slot; and
    a first hinged portion extending from the engaging portion in a length direction of the support member, and the first hinged portion being hinged with the first fixed seat.

11. The hinge component according to claim 10, wherein the first fixed seat comprises two first support portions opposite to and spaced apart from each other, the first hinged portion is hinged with the first support portion, and the engaging portion is located between the two first support portions.

12. The hinge component according to claim 10, wherein the first sliding seat comprises a first recessed portion at a side of the first sliding seat facing towards the first fixed seat.

13. The hinge component according to claim 10, wherein the second sliding seat comprises a second recessed portion at a side of the second sliding seat facing towards the second fixed seat.

14. The hinge component according to claim 1, wherein the second fixed seat comprises:
    a second body; and
    a second support portion located on a side of the second body in a width direction of the support member and facing towards the second sliding seat, the second hinged portion being hinged with the second support portion.

15. A foldable screen assembly, comprising:
a flexible screen; and
a hinge component, the flexible screen being on the hinge component and covering the hinge component, the hinge component comprising:
   a support assembly comprising at least three support members, the at least three support members being arranged side by side, and two adjacent support members being movably connected; and
   a linkage assembly connected with the at least three support members to achieve a mutual linkage of the at least three support members,
wherein the linkage assembly comprises:
a first sliding seat on a first one of the at least three support members; and
a synchronizer comprising a first end slidably connected with the first sliding seat, and a second end hinged with a second one of the at least three support members,
wherein the linkage assembly comprises a swing arm assembly on at least one support member side by side with the first sliding seat and the synchronizer,
wherein the swing arm assembly comprises:
a second fixed seat fixed on a third one of the at least three support members;
a swing arm, a first end of the swing arm being hinged with the second fixed seat; and
a second sliding seat, a second end of the swing arm being slidably connected with the second sliding seat, and the second sliding seat being fixed on a fourth one of the at least three support members,
wherein the support assembly comprises:
a first support member located on the outermost side, the second sliding seat being fixed on the first support member;
a second support member adjacent to the first support member, the first sliding seat being fixed on the second support member;
a third support member adjacent to the second support member, the second fixed seat being fixed on the third support member; and
a fourth support member located at middle, the fourth support member comprising a first fixed seat hinged with the second end of the synchronizer,
wherein the synchronizer comprises:
an engaging portion engaged with an engaging portion of another synchronizer symmetrical to the synchronizer with respect to the fourth support member;
a first leading portion extending from the engaging portion along a width direction of the support member, the first sliding seat comprising a first slot, the first leading portion being movably inserted in the first slot; and
a first hinged portion extending from the engaging portion in a length direction of the support member, and the first hinged portion being hinged with the first fixed seat,
wherein the first fixed seat comprises two first support portions opposite to and spaced apart from each other, the first hinged portion is hinged with the first support portion, and the engaging portion is located between the two first support portions.

16. A foldable terminal device, comprising a foldable screen assembly, the foldable screen assembly comprising:
a flexible screen; and
a hinge component, the flexible screen being on the hinge component and covering the hinge component, the hinge component comprising:
   a support assembly comprising at least three support members, the at least three support members being arranged side by side, and two adjacent support members being movably connected; and
   a linkage assembly connected with the at least three support members to achieve a mutual linkage of the at least three support members,
wherein the linkage assembly comprises:
a first sliding seat on a first one of the at least three support members; and
a synchronizer comprising a first end slidably connected with the first sliding seat, and a second end hinged with a second one of the at least three support members,
wherein the linkage assembly comprises a swing arm assembly on at least one support member side by side with the first sliding seat and the synchronizer,
wherein the swing arm assembly comprises:
a second fixed seat fixed on a third one of the at least three support members;
a swing arm, a first end of the swing arm being hinged with the second fixed seat; and
a second sliding seat, a second end of the swing arm being slidably connected with the second sliding seat, and the second sliding seat being fixed on a fourth one of the at least three support members,
wherein the swing arm comprises:
a second hinged portion comprising two ends hinged with the second fixed seat in a length direction of the support member; and
a second leading portion, a first end of the second leading portion being connected with a middle part of the second hinged portion, the second sliding seat comprising a second slot, and a second end of the second leading portion being movably inserted in the second slot.

* * * * *